(12) United States Patent
Ma

(10) Patent No.: US 7,608,811 B2
(45) Date of Patent: Oct. 27, 2009

(54) MINIMAL DEPTH LIGHT FILTERING IMAGE SENSOR

(75) Inventor: Guolin Ma, Milpitas, CA (US)

(73) Assignee: Aptina Imaging Corporation, Grand Cayman, KY (US)

( * ) Notice: Subject to any disclaimer, the term of this patent is extended or adjusted under 35 U.S.C. 154(b) by 0 days.

(21) Appl. No.: 10/851,012

(22) Filed: May 21, 2004

(65) Prior Publication Data

US 2005/0258351 A1  Nov. 24, 2005

(51) Int. Cl.
*H01L 33/00* (2006.01)
(52) U.S. Cl. .................... 250/226; 257/223; 257/88; 257/294; 438/70
(58) Field of Classification Search ................ 250/239, 250/208.1, 226; 257/294, 223, 88; 438/70
See application file for complete search history.

(56) References Cited

U.S. PATENT DOCUMENTS

| 4,081,277 A * | 3/1978 | Brault et al. ............... 250/226 |
| 5,140,396 A * | 8/1992 | Needham .................... 257/294 |
| 6,362,498 B2 * | 3/2002 | Abramovich ............... 257/233 |
| 2002/0063214 A1 | 5/2002 | Hsiao et al. |
| 2003/0038293 A1 * | 2/2003 | Fasen ......................... 257/88 |
| 2003/0043589 A1 * | 3/2003 | Blank ......................... 362/494 |
| 2004/0169125 A1 * | 9/2004 | Yamada ..................... 250/208.1 |
| 2004/0188597 A1 * | 9/2004 | Inoue ....................... 250/214 R |
| 2005/0121599 A1 * | 6/2005 | Mouli ...................... 250/208.1 |
| 2005/0224694 A1 * | 10/2005 | Yaung ...................... 250/208.1 |
| 2008/0197505 A1 | 8/2008 | Asakawa |

FOREIGN PATENT DOCUMENTS

EP  1 414 068 A2  4/2004

OTHER PUBLICATIONS

German Patent Application 102005005590.7-33 office action dated Sep. 5, 2006.
English Translation of German Patent Application 102005005590.7-33 office action dated Sep. 5, 2006.

* cited by examiner

*Primary Examiner*—Georgia Y Epps
*Assistant Examiner*—Tony Ko
(74) *Attorney, Agent, or Firm*—Ratner Prestia

(57) ABSTRACT

A method and apparatus for directing light to a light sensor and filtering out an infrared component from the directed light. In one embodiment, the apparatus includes an array of light sensors disposed on a substrate, wherein the light sensors are operable to convert light intensity into a voltage signal. The apparatus further includes a cover plate disposed over the light sensors such that the cover plate creates a cavity over the array of sensors. The apparatus further includes filter material disposed between the cover plate and the light sensors in the cavity formed between the light sensors and the cover plate. The filter material is operable to filter the light passing through the cover plate. In particular, in one embodiment, light having wavelengths in the infrared range may be filtered out.

14 Claims, 3 Drawing Sheets

MINIMAL DEPTH LIGHT FILTERING IMAGE SENSOR

BACKGROUND OF THE INVENTION

Digital cameras and other imaging devices typically have a light sensing apparatus for capturing and storing images. For example, in one popular design, an array of photodiodes, typically arranged in a charge-coupled device (CCD) or on a complimentary metal-oxide semiconductor (CMOS) microchip, are used for capturing and storing images. Each photodiode and its associated circuitry, (the combination of which is often called an Active Pixel Sensor (APS) or more simply, a pixel), converts the light intensity detected at the photodiode into a voltage signal that can be digitized for storage, reproduction, and manipulation. Both CMOS and CCD chips sense light through similar mechanisms, by taking advantage of the photoelectric effect, which occurs when photons interact with crystallized silicon to promote electrons from the valence band into the conduction band. Thus, the quality of the image that is captured is reflective of how much light and the manner in which the light reaches the light sensor (i.e., the photodiode). That is, parameters such as angle of incidence, light beam manipulation, and light beam filtering are important to control in order to ensure the capture of a high quality image that accurately reflects the true and correct image being captured.

One such parameter that affects the quality of the image captured is the amount of infrared light that reaches the light sensor. It is well known that visible light (to the human eye) has a wavelength range of 400 to 700 nm. Just beyond the visible light range is the infrared range that is defined by light having a wavelength in the range of 700 to 2500 nm. A subset of the infrared range is the near-visible infrared (NIR) range which is more of a concern to the digital imaging industry. The NIR range is defined by light having a wavelength in the range of 700 to 1200 nm. Particularly, in CMOS arrays, too much NIR light causes the captured image to appear washed out. That is, the contrast between the colors is not as sharp as it appears in real life. As such, it is important to filter out NIR light from visible light when capturing an image with a CMOS device or any other device that utilizes a light sensor to convert the intensity of incident light into a voltage signal.

In the past, interference or absorption IR filters have been designed and used in image-capturing devices to filter out infrared light from visible light in a number of different applications. Typically, an interference IR filter reflects IR light before it reaches the light-capturing device and an absorption IR filter absorbs the IR light before it reaches the light-capturing device. IR filters are designed to pass visible light having wavelengths below 700 nanometers while blocking infrared light having higher wavelengths extending into the near-infrared region (700 to 1200+ nanometers). Such an IR filter is often utilized to protect infrared-sensitive CMOS arrays typically incorporated in digital-imaging devices from infrared wavelengths. Thus, when an infrared filter is used within the optical path (i.e., the filter arranged such that incident light must pass through the filter in order to reach the light sensor), the negative effects of infrared light are reduced when capturing an image.

For example, FIG. 1 is a cutaway view of a conventional CMOS array 100 that is typically used in a conventional image-capturing device. The CMOS array 100 includes an IR filter 135 in the optical path between incident light 190 and each pixel 101, 102, and 103. The conventional CMOS array 100 includes a plurality of pixels 101, 102, and 103 arranged in columns and rows. The columns and rows are not shown for clarity; however, portions of the adjacent pixels 102 and 103 in the same row are shown in FIG. 1 to the left and to the right of pixel 101.

Each pixel 101 includes a photodiode 105 embedded in a silicon substrate 104 and each photodiode 105 is associated with electronic circuitry (not shown for clarity) contained in adjacent metal layers 110. Together, the photodiode 105 and its associated electronic circuitry in the metal layers 110 form a collection well 107 whereby incident light 190 may be directed toward the photodiode 105. In order to concentrate incident photons (from the incident light 190) into the collection well 107, the collection well 107 is capped by a miniature, positive-meniscus lens known as a microlens 120, or lenticular.

One particular kind of pixel 101 is a standard three-transistor pixel which is well known in the art and will not be discussed in detail herein. When a broad wavelength band of visible light 190 is incident on a pixel 101, a variable number of electrons are released from the semiconductor 104 in proportion to the photon-flux density incident on the surface of a photodiode. In effect, the number of electrons produced is a function of the wavelength and the intensity of light striking the semiconductor 104. Electrons are collected in a potential well (not shown) until an integration period is complete (as determined by the associated circuitry), and then the collected electrons are converted into a voltage signal. The voltage signal can then passed through an analog-to-digital converter (not shown in FIG. 1), which forms a digital electronic representation of the image, pixel by pixel, captured by the CMOS array 100.

The columns and rows of pixels 101 that form the CMOS array 100 are collectively covered by a cover glass 130 or a cover plate to form a shellcase package. The cover glass 130 fits securely on portions of the metal layer 110 over the array of pixels 101 such that a cavity 121 is formed over the microlens 120 of each pixel 101. In conventional CMOS arrays 100, this cavity 121 is filled only with air or may be a vacuum. Typically, the shellcase package is manufactured as a unit and then any modifications, such as adding an absorption filter 135, are accomplished during a separate manufacturing phase. As can be seen in the conventional CMOS array 100 of FIG. 1, an IR filter 135 is disposed on top of the cover glass 130. The IR filter 135 is designed to filter out or absorb light having wavelengths in the infrared range (i.e., greater than about 700 nm). As such, any NIR light within the incident light 190 will be filtered out before reaching the pixel 101 below.

Conventional IR filters 135 are commonly manufactured from dyed glass and comprise the most widely used types of filters for the attenuation of infrared light in digital-image-capturing devices. The absorption of specific wavelengths, that is, the filter's spectral performance, is a function of the physical thickness of the conventional IR filter 135 and the amount of dye present in the glass of the filter. Conventional IR filters 135 are made primarily from colored filter glass, and represent the largest class and most widely used type of filters for applications that do not require a precise definition of transmitted wavelengths. These conventional filters are commonly available in the form of glass, plastic-coated glass, acetate. Among the materials used in glass filters are the rare earth transition elements, colloidal dyes (such as selenide), and other molecules having high extinction coefficients that produce reasonably sharp absorption transitions.

Conventional absorption filters, such as absorption filter 135, are expensive and bulky and add to the overall depth of the optical path and bulk to the shellcase package. A typical absorption filter 135 is 10 microns thick which adds additional depth to the top of the shellcase package that includes the CMOS array 100. Further, the inclusion of a typical absorption filter 135 in a digital-image-capturing device requires an additional manufacturing step of affixing the absorption filter to the top of the glass cover 130. Because this manufacturing step is typically not performed in a clean room during the fabrication of the CMOS array 100, particulates and/or dust often may become embedded between the cover glass 130 and the absorption filter 135. Such dust and particulates may greatly affect the performance of the CMOS array 100 in the image-capturing device. Thus, the manufacturing complexity and assembly process adds to the cost and time required to produce a CMOS array 100 suitable for digital image-capturing devices.

Thus, it would be most beneficial to have a shellcase package with an integrated absorption filter that does not require the additional manufacturing steps associated with or the inherent drawbacks of conventional absorption filters 135 as shown in FIG. 1.

SUMMARY OF THE INVENTION

An embodiment of the invention is directed to an apparatus for directing light to a light sensor and filtering out an infrared component from the directed light. The apparatus includes an array of light sensors disposed on a substrate, wherein the light sensors are operable to convert light intensity into a voltage signal. The apparatus further includes a cover plate disposed over the light sensors such that the cover plate creates a cavity over the light sensor array. The cover plate is operable to pass light. That is, the cover plate does not contain a film covering of glass filter that may filter out o portion of any incident light. The apparatus further includes filter material disposed between the cover plate and the light sensors in the cavity formed between the light sensors and the cover plate. The filter material is operable to filter a portion of the light passing through the cover plate. In particular, in one embodiment, light having wavelengths in the infrared range (700-2500 nm) may be filtered out such that only light having wavelengths below about 700 nm is able to pass through the cover plate and the filter material to excite electrons in the light sensor below.

Having an integrated IR filter that is underneath the cover plate in the cavity formed therein is advantageous because the overall depth of the apparatus is reduced as compared to an apparatus having a filter plate coupled on top of the cover plate. Further, there is a smaller likelihood that particulates or dust may become embedded in the apparatus such that optical performance is degraded because the integrated filter material is injected or otherwise manufactured in concert with the rest of the apparatus. As such, since this manufacturing is typically performed in a clean room and the apparatus is self-contained, i.e., a single shellcase package, the chances of particulates or dust becoming embedded in the apparatus within the optical path is greatly reduced.

Further, filter material is less expensive than a filter cover plate or a filter film and the filter material is not subject to degradation due to scratching and/or abrasion as is the case with conventional filter cover on a typical conventional image-capture apparatus.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following discussion is presented to enable a person skilled in the art to make and use the invention. The general principles described herein may be applied to embodiments and applications other than those detailed above without departing from the spirit and scope of the present invention. The present invention is not intended to be limited to the embodiments shown, but is to be accorded the widest scope consistent with the principles and features disclosed or suggested herein.

Figure 1:
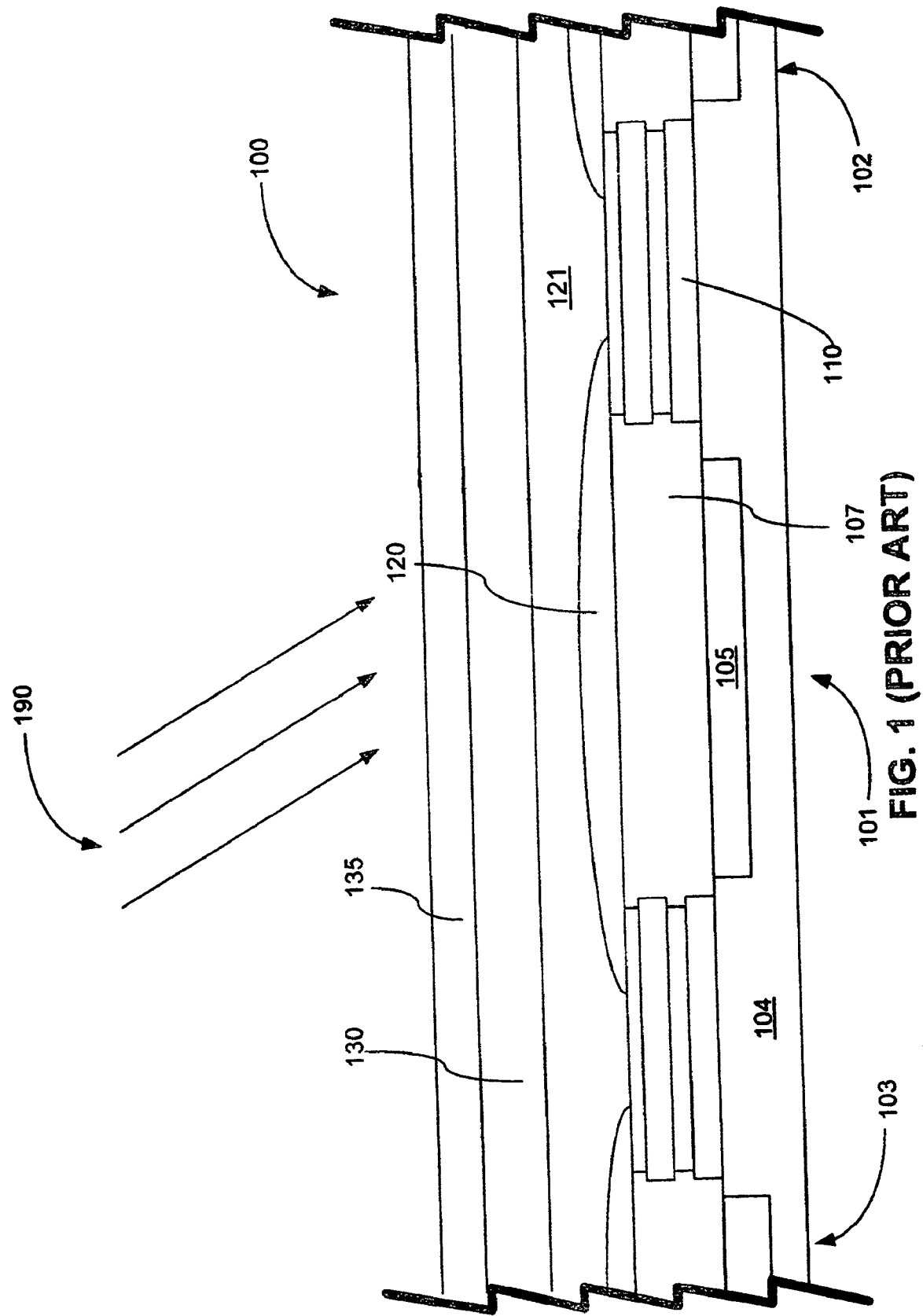
FIG. 1 is a cutaway view of a conventional CMOS array having an absorption filter in the optical path between incident light and each pixel.
Figure 2:
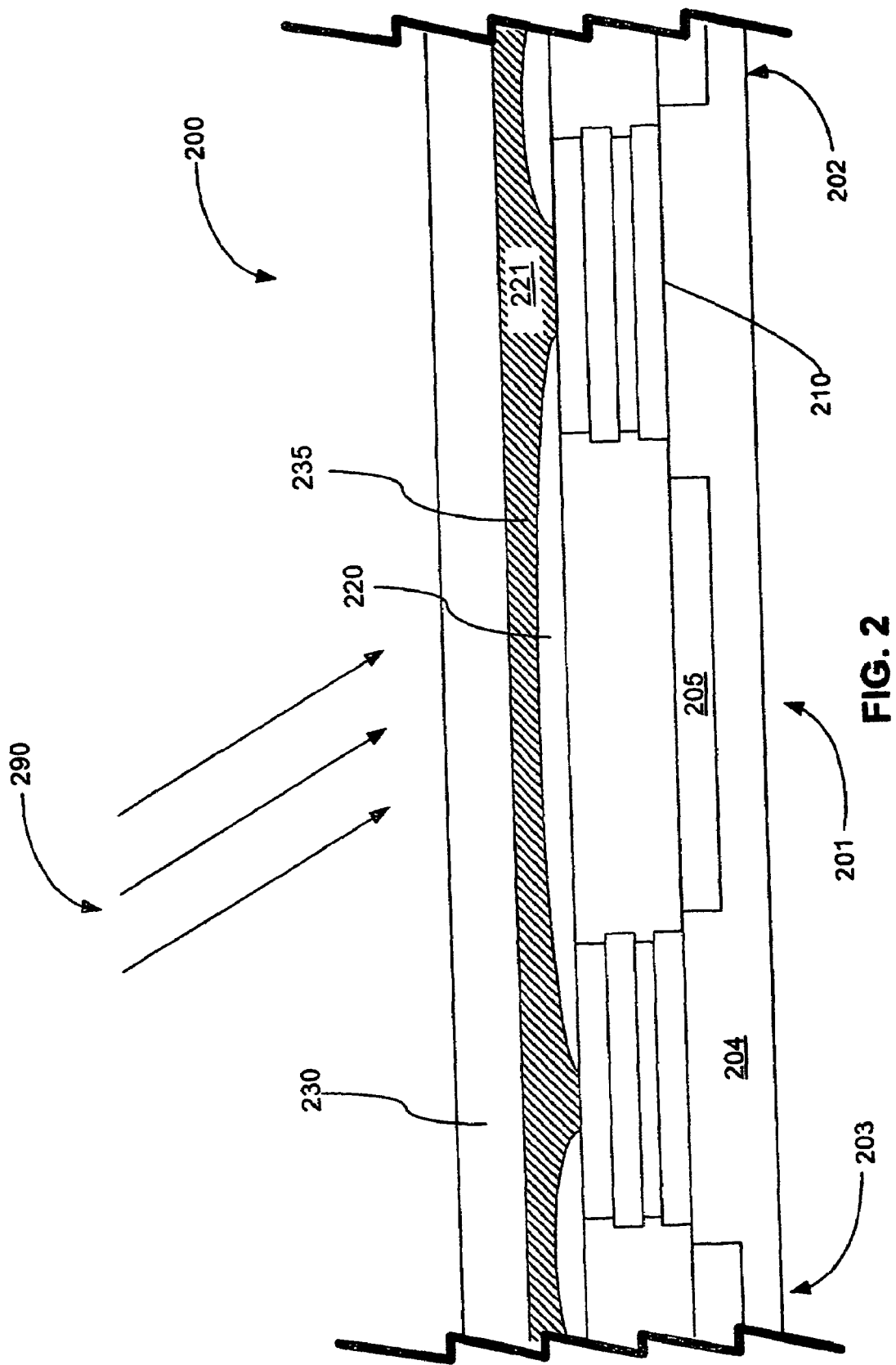
FIG. 2 is a cutaway view of a CMOS array having an absorption filter material disposed inside a cavity within the shellcase package that lies in the optical path between incident light and each pixel.

FIG. 2 is a cutaway view of a CMOS array 200 having a filter material 235 in the optical path between cover glass 230 and each photodiode 205. As is the case with conventional CMOS arrays (such as CMOS array 100 depicted in FIG. 1), the CMOS array 200 includes a plurality of pixels 201, 202 and 203 arranged in columns and rows (all pixels are not shown for clarity) disposed in a silicon substrate 204. Each pixel, such as pixel 201, includes an associated photodiode 205, electronic circuitry (also not shown for clarity) contained in adjacent metal layers 210, and a microlens 220 as described previously. The columns and rows of pixels 201 again form the CMOS array 200 and are collectively covered by the cover glass 230. The covered CMOS array 200 is referred to as a shellcase package.

The cover glass 230 fits securely on top of the array of pixels 201 such that a cavity 221 is formed above the pixel array. In this embodiment, the cavity 221 spans the entire array of pixels 201 such that the cover glass 230 is coupled to the contact points with the metal layers on the substrate in a limited number of places such as the outermost edges (not shown) of the pixel CMOS array 200. In another embodiment, individual cavities (not shown) may be formed to correspond to an associated pixel 201 on a one-for-one basis. Regardless of which embodiment or how the cover glass 230 is coupled with the metal layers 210, a cavity 221 is formed in some fashion between each pixel 201 and the cover glass 230.

In this embodiment, the formed cavity 221 is filled with a filter material. The filter material may be a polymer, (i.e., a gel-like substance) filled with an absorptive dye. The absorptive dye is manufactured such that tiny particulates interact with the incident light 290 which absorbs (i.e., filters) infrared light from the light 290 that passes through the cover glass 230 and the cavity 221 to the photodiode 205. In one embodiment, the absorptive dye in the polymer is customized such that light having wavelengths above 650 nm is substantially filtered out while light having wavelengths below 650 nm is left substantially unfiltered and able to pass through to the photodiode 205.

The quality of filter material used in the manufacture of the polymer is of optical grade and provides uniformity of density and color over the entire volume of the cavity 221. The filter material filters light through absorption so the spectral performance of the filter material is dependent upon the thickness and optical density of the filter material. Increasing the thickness will produce a corresponding increase in the blocking level of unwanted wavelengths, but also reduces the peak in-band transmission, causing falloff at the ends of absorption bands.

Using a polymer filter material is cost effective (when compared to the separately fabricated glass or plastic filters, such as absorptive filter 135 in FIG. 1) and optically satisfactory for filtering infrared light. Polymer filter material is commercially available, making this filter material suitable for a wide variety of applications, despite the gentle handling typically required.

There are several advantages to using polymer filter material in the cavity between the cover glass 230 and the photodiode 205. These advantages include the relatively low cost and the stability under a wide variety of climates and operating conditions. In addition, the polymer filter material may be constructed with light-absorbing chemical species mixed throughout the filter material, rather than being deposited on the surface of a filter plate as is the case with film or glass filters described above with respect to FIG. 1. Thus, polymer filter material is not prone to destruction by minor scratches or abrasions. Further, polymer filter material is not sensitive to the angle of incident light 290 and provides uniform spectral characteristics at virtually any angle of incidence.

Additionally, typical manufacturing steps include the injecting of the polymer filter material into the cavity while the entire shellcase package is being fabricated in a clean room. Thus, the chance of particulates and/or dust becoming embedded inside the shellcase package or between the cover plate and a conventional filter plate (as is the case in prior art) is greatly reduced.

Further yet, because the filter is no longer embodied in a plate or film that is external to the shellcase package, the overall depth of the shellcase package is reduced. Reducing the depth of the shellcase package is advantageous because the shellcase package then has a lower profile that may be able to be fit in shallower digital-image capturing devices.

Figure 3:
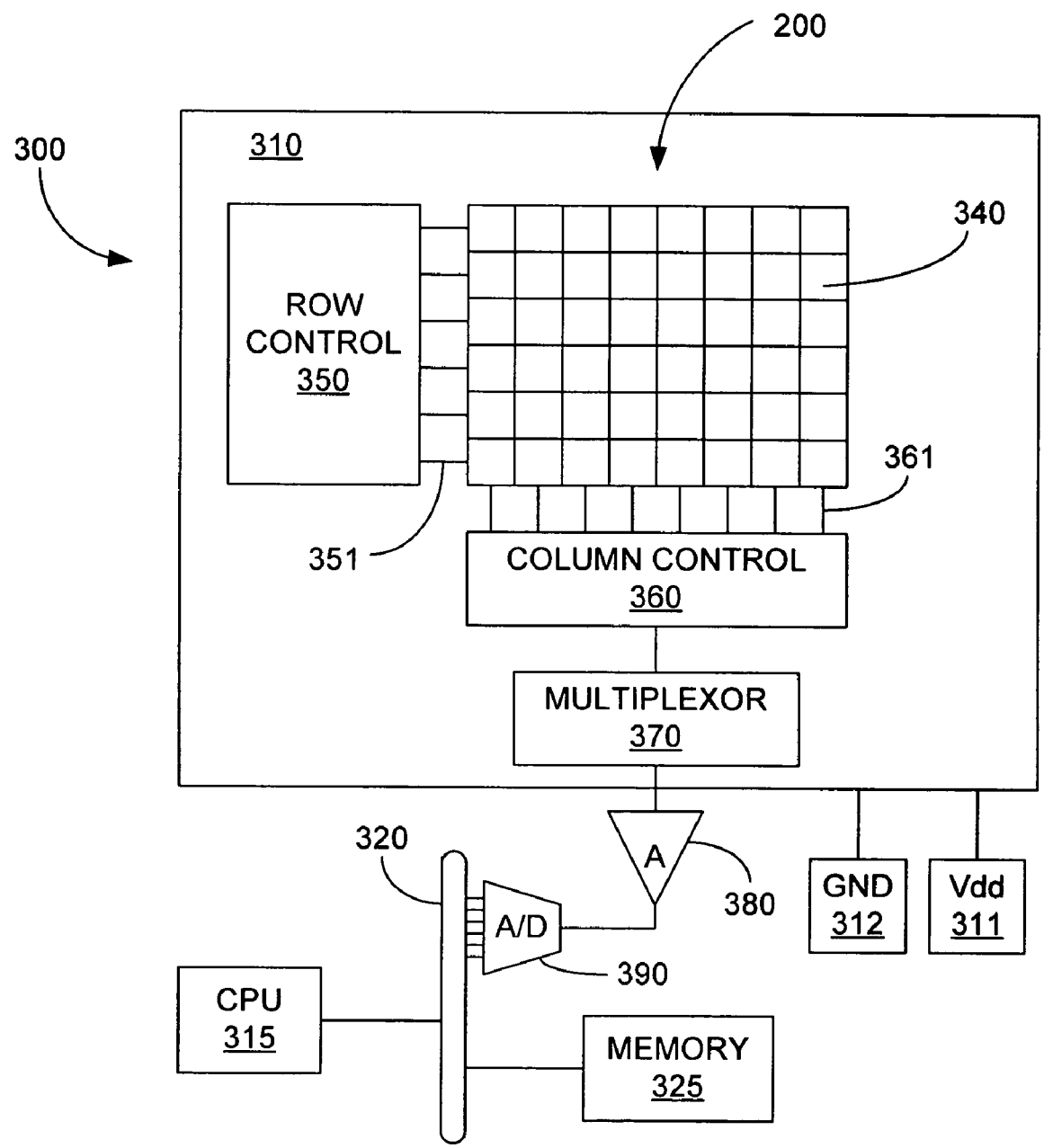
FIG. 3 is a block diagram of a system that includes a CMOS array of FIG. 2, disposed therein.

FIG. 3 shows a block diagram of a system 300 that includes a CMOS array 200 of FIG. 2, disposed therein. The system 300 may be a digital camera, digital camera-phone, or other electronic device utilizing a digital image-capturing apparatus. Such an apparatus may be of any size and number of pixels each containing a respective photodiode.

The CMOS array 200 is able to integrate a number of processing and control functions, which lie beyond the primary task of photon collection, directly onto a single shellcase package. These features generally include timing logic, exposure control, analog-to-digital conversion, shuttering, white balance, gain adjustment, and initial image processing algorithms. In order to perform all of these functions, the CMOS integrated circuit architecture more closely resembles that of a random-access memory cell rather than a simple photodiode array. One popular CMOS array 200 is built around active pixel sensor (APS) technology in which both the photodiode 205 and a readout amplifier (not shown, although within the metals layers 210 are incorporated into each pixel 201. This enables the charge accumulated by the photodiode 205 to be converted into an amplified voltage signal inside the pixel 201 and then transferred in sequential rows and columns to the analog signal-processing portion of the chip.

Thus, each pixel 201 contains, in addition to a photodiode 205, a triad of transistors that converts accumulated electron charge to a measurable voltage, resets the photodiode, and transfers the voltage to a vertical column bus. The resulting array is an organized checkerboard of metallic readout busses that contain a photodiode 205 and associated signal preparation circuitry at each intersection, i.e., each pixel 201. The busses apply timing signals to the photodiodes 205 and return readout information back to the analog decoding and processing circuitry housed away from the CMOS array 200. This design enables signals from each pixel 201 in the array to be read with simple x, y addressing techniques.

The photodiode 205 is a key element of a digital image sensor. Sensitivity is determined by a combination of the maximum charge that can be accumulated by the photodiode 205, coupled to the conversion efficiency of incident photons to electrons and the ability of the device to accumulate the charge in a confined region without leakage or spillover. These factors are typically determined by the physical size and aperture of the photodiode 205, and its spatial and electronic relationship to neighboring elements in the CMOS array 200. Another factor is the charge-to-voltage conversion ratio, which determines how effectively integrated electron charge is translated into a voltage signal that can be measured and processed.

Photodiodes are typically organized in an orthogonal grid that may range in size from 128×128 pixels (16 K pixels) to a more common 1280×1024 (over a million pixels). Several of the latest CMOS arrays 200, such as those designed for high-definition television (HDTV), contain several million pixels organized into very large arrays of over 2000 square pixels. The signals from all of the pixels 201 composing each row and each column of the array must be accurately detected and measured (read out) in order to assemble an image from the photodiode charge accumulation data.

The system of FIG. 3 includes a central processing unit (CPU) 315 coupled with a bus 320. Also coupled with the bus 320 is a memory 325 for storing digital images captured by the CMOS array 200. The CPU 315 facilitates an image capture by controlling the CMOS array 200 through the bus 325 and, once an image is captured, storing of the image in a digital format in the memory 325.

The CMOS array 200 includes several components for facilitating the capture and digitizing of an image as described above with respect to FIG. 2 and that which is well-known in the art with respect to image capture electronics. Each pixel 201 in the CMOS array 200 is coupled to row control circuitry 350 via connections 351 and to column control circuitry 360 via connections 361 which facilitate the control signals for capturing an image. Further, each pixel 201 in the CMOS array 200 is coupled to Vdd 311 and GROUND 312 (individual connection not shown).

During a typical image capture procedure, the voltage signal for each pixel 201 is read by the column control circuitry 360 and sent to a multiplexor 370. The multiplexor 370 combines each voltage signal into a single multiplexed signal which represents the voltage signal captured at each photodiode 205 of each pixel 201. After an amplification stage 380, this signal is converted into a digital signal via an analog-to-digital converter 390 before being communicated to the bus 320. The CPU 315 then facilitates the storage in the memory 325 of the multiplexed digital signal By incorporating the filter material which accomplishes the task of filtering out infrared light form any incident light that may reach the CMOS array 200, the system 300 in FIG. 3 may be contained in a shallower environment and/or housing.

I claim:
1. An apparatus, comprising:
    a light sensor disposed on a substrate, the light sensor operable to convert light intensity into a voltage signal;

a cover plate disposed over the light sensor to form a cavity, having a volume, between the light sensor and the cover plate, the cover plate operable to pass light;

a gel-like filter material filling the entire volume of the cavity between the light sensor and the cover plate, the gel-like filter material operable to filter at least a portion of the light passing through the cover plate and onto the light sensor.

2. The apparatus of claim 1 wherein the gel-like filter material comprises a polymer.

3. The apparatus of claim 1 wherein the gel-like filter material comprises an absorptive dye.

4. The apparatus of claim 1 wherein the portion of light filtered by the gel-like filter material comprises infrared light.

5. The apparatus of claim 1 wherein the portion of light filtered by the gel-like filter material comprises near infrared light.

6. The apparatus of claim 1, further comprising a microlens coupled to the substrate and operable to focus the filtered light onto the light sensor.

7. The apparatus of claim 1 wherein the cover plate comprises transparent glass.

8. The apparatus of claim 1 wherein the light sensor is a photodiode.

9. The apparatus of claim 8, further comprising a three-transistor active-pixel sensor electrically coupled to the photodiode and operable to facilitate the conversion of light to a voltage signal.

10. A system, comprising:
a CMOS array having:
a plurality of light sensors disposed on a substrate, each light sensor operable to convert light intensity into a voltage signal;
a cover plate disposed over the plurality of light sensors to form a cavity, having a volume, between the plurality of light sensors and the cover plate, the cover plate operable to pass light;
a gel-like filter material filling the entire volume of the cavity between the plurality of light sensors and the cover plate, the gel-like filter material operable to filter at least a portion of the light passing through the cover plate;
a control circuit coupled to the CMOS array and operable to sense each of the voltage signals individually and to store each of the sensed voltage signals in a memory; and
a processor coupled to the control circuit and operable to control the control circuit.

11. The system of claim 10 wherein the gel-like filter material comprises a polymer having absorptive dye and operable to filter an infrared component from the light.

12. A method of manufacture, comprising:
fabricating a plurality of active-pixel sensors on a substrate, each active pixel sensor having a light sensor operable to convert light intensity into a voltage signal;
disposing a cover plate over the substrate such that a cavity is formed adjacent the cover plate;
filling the cavity with a filter material operable to filter a component of light that passes through the filter material and onto the plurality of active-pixel sensors.

13. The method of claim 12 wherein the filter material comprises a polymer having absorptive dye and operable to filter an infrared component from the light.

14. The method of claim 12, wherein the filling further comprises injecting the polymer into each cavity.

* * * * *